(12) United States Patent
Poupon et al.

(10) Patent No.: US 8,330,462 B2
(45) Date of Patent: Dec. 11, 2012

(54) REAL-TIME MAGNETIC RESONANCE DIFFUSION IMAGING

(75) Inventors: Cyril Poupon, Villebon-sur-Yvette (FR);
Fabrice Poupon, Villebon-sur-Yvette (FR); Alexis Roche, Guigneville en Essonne (FR); Jean-François Mangin, Gif sur Yvette (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 303 days.

(21) Appl. No.: 12/739,454

(22) PCT Filed: Oct. 24, 2008

(86) PCT No.: PCT/IB2008/003403
§ 371 (c)(1),
(2), (4) Date: Aug. 23, 2010

(87) PCT Pub. No.: WO2009/053845
PCT Pub. Date: Apr. 30, 2009

(65) Prior Publication Data
US 2010/0308821 A1    Dec. 9, 2010

(30) Foreign Application Priority Data

Oct. 25, 2007 (EP) .................................. 07291292

(51) Int. Cl.
*G01R 3/00* (2006.01)
(52) U.S. Cl. ......... 324/309; 324/300; 324/307; 324/310
(58) Field of Classification Search .................... None
See application file for complete search history.

(56) References Cited

U.S. PATENT DOCUMENTS

| | | | |
|---|---|---|---|
| 7,706,857 B2 * | 4/2010 | Aletras et al. ................. | 600/410 |
| 7,949,384 B2 * | 5/2011 | Lewin et al. .................. | 600/407 |
| 2003/0216634 A1 | 11/2003 | van Muiswinkel et al. | |

(Continued)

FOREIGN PATENT DOCUMENTS

WO    WO-95/04940 A1    2/1995

(Continued)

OTHER PUBLICATIONS

Dubois et al., "Optimized Diffusion Gradient Orientation Schemes for Corrupted Clinical DTI Data Sets," *Magnetic Resonance Materials in Physics*, vol. 19, No. 3, 2006, pp. 134-143.

(Continued)

*Primary Examiner* — Jermele M Hollington
*Assistant Examiner* — Trung Nguyen
(74) *Attorney, Agent, or Firm* — Alston & Bird LLP

(57) ABSTRACT

A method for performing magnetic resonance diffusion imaging, comprising: (a) acquiring a sequence of magnetic resonance images of a target body (BS) using diffusion-encoding gradient pulses applied along a set of non-collinear orientations ( ) sampling a three-dimensional orientation space (AR); (b) estimating, from said sequence of images, a set of space- and orientation-dependent parameters representative of molecular diffusion within said target body; wherein said step of estimating a set of space- and orientation-dependent parameters representative of molecular diffusion within said target body is performed in real time by means of an incremental estimator such as a Kalman filter fed by data provided by said magnetic resonance images; characterized in that said three-dimensional orientation space (AR) selectively excludes a set of orientations (FR) for which magnetic resonance signal intensity is attenuated by diffusion below a threshold level.

17 Claims, 4 Drawing Sheets

U.S. PATENT DOCUMENTS

2007/0038072 A1    2/2007    Guhring et al.

FOREIGN PATENT DOCUMENTS

WO    WO-99/63355 A1    12/1999

OTHER PUBLICATIONS

Kwatra et al., "Accelerating DTI Tractography Using FPGAs," *Proceedings from the 20th International Symposium on Parallel and Distributed Processing*, Apr. 2006, pp. 1-8.

Peng et al., "Diffusion Tensor Encoding Schemes Optimized for White Matter Fibers with Selected Orientations," *Magnetic Resonance Imaging*, Nov. 28, 2006, vol. 25, No. 2, pp. 147-153.

Poupon et al., "Real-Time MR Diffusion Tensor and Q-ball Imaging Using Kalman Filtering," *Medical Image Analysis*, vol. 12, No. 5, Jun. 19, 2008, pp. 527-534.

Raguin et al., "Parameter Estimation Analysis of Diffusion-Weighted MRI Protocols Used for Soft Tissue Fiber Reconstruction," *Proceedings of Inverse Problems Symposium*, East Lansing, Michigan, Jun. 11-12, 2007, pp. 1-2.

Tuch, David S., "Q-Ball Imaging," *Magnetic Resonance in Medicine*, vol. 52, 2004, pp. 1358-1372.

The International Search Report and Written Opinion for International Appl. No. PCT/IB2008/003403, mailed Mar. 23, 2009.

\* cited by examiner

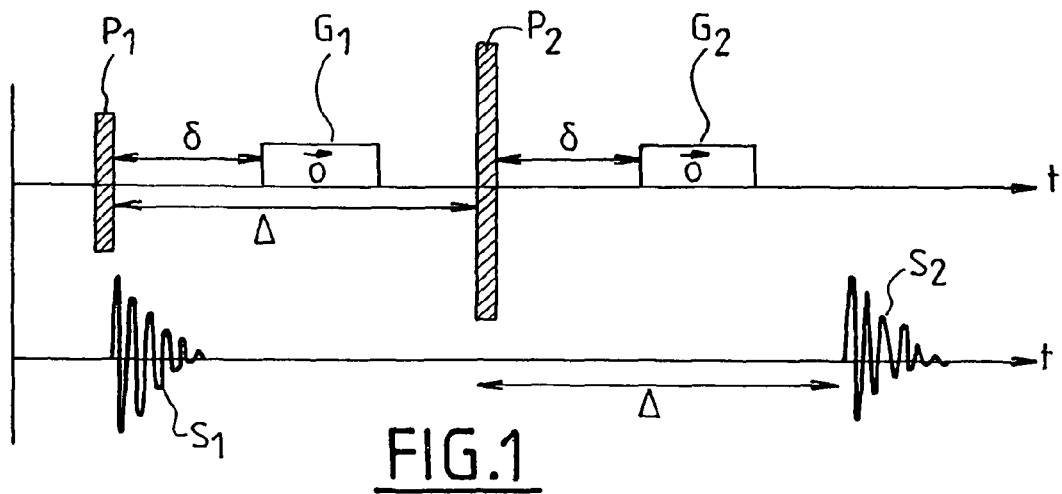
FIG.1
   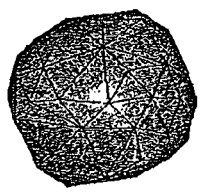   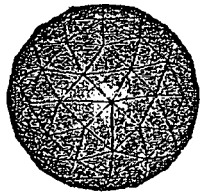
FIG.3A                FIG.3B                FIG.3C
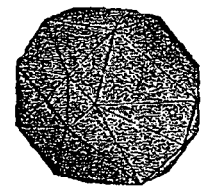   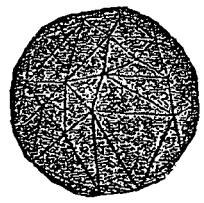   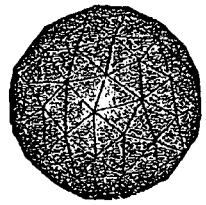
FIG.4A                FIG.4B                FIG.4C

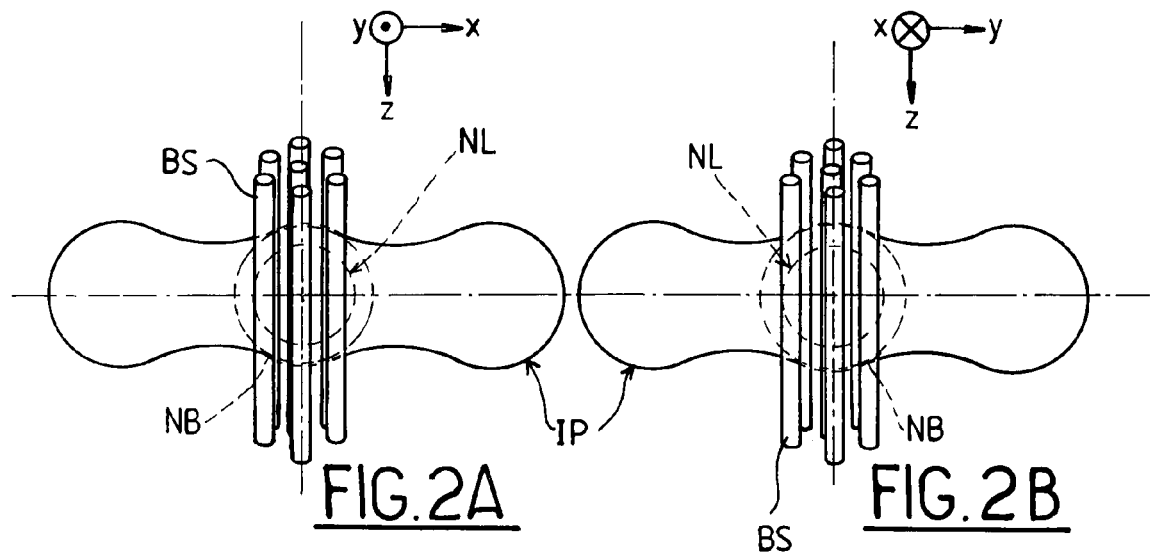
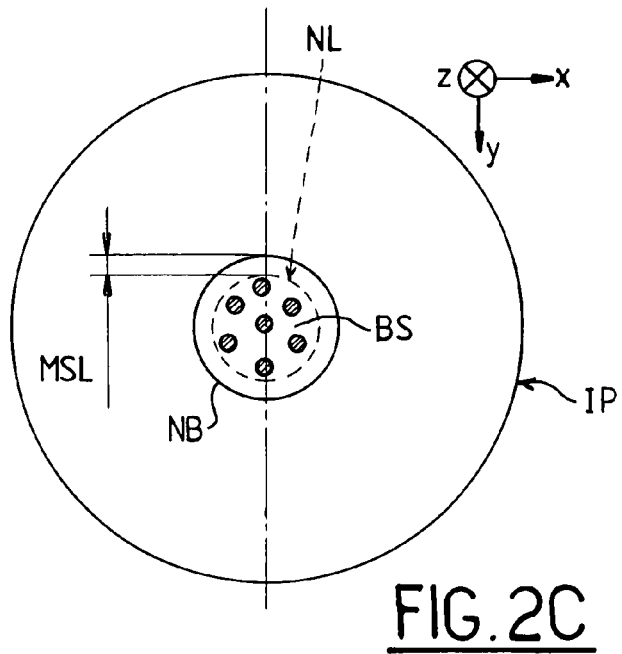

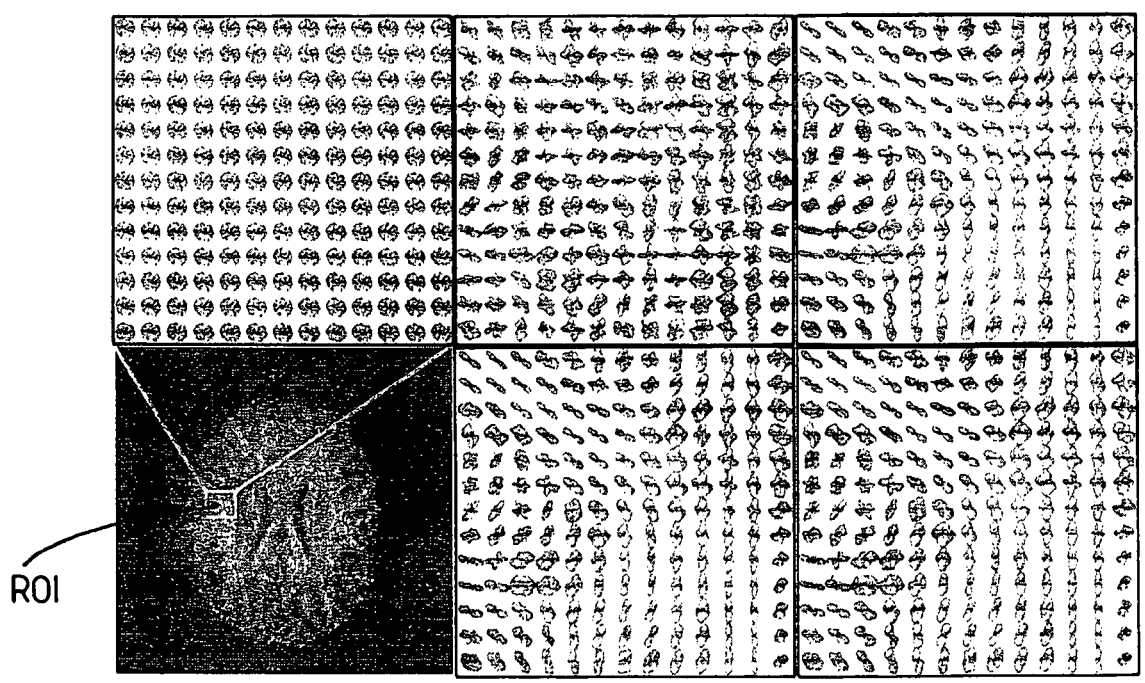

REAL-TIME MAGNETIC RESONANCE DIFFUSION IMAGING

FIELD OF THE INVENTION

The invention relates to a method for performing magnetic resonance diffusion imaging in real time.

BACKGROUND

Magnetic resonance (MR) diffusion imaging has become an established technique for inferring structural anisotropy of tissues, and more particularly for mapping the white matter connectivity of the human brain [1]. The term "diffusion" refers here to the Brownian motion of (typically) water molecules inside tissues, resulting from their thermal energy.

Several mathematical models of molecular diffusion in tissues have been designed, becoming more and more complex over the last decade while attempting to make less and less assumptions. The simplest, and oldest, model is the Diffusion Tensor (DTI) introduced by Basser [2]. According to this model, which is still widely used despite its limitations and the unrealistic assumptions on which is relies, the diffusive properties of a body can be expressed by the six independent elements of a symmetric, bi-dimensional, three-by-three diffusion tensor. Among the more recent and more sophisticated models, the Q-ball model (QBI) introduced by Tuch [3] and belonging to the class of high angular resolution diffusion imaging (HARDI) models, is worth mentioning.

In any case, magnetic resonance diffusion imaging involves acquiring MR signals by applying to said target body a number of spin echo pulse sequences, together with corresponding pairs of diffusion-encoding gradient pulses along a set of non-collinear orientations. The pairs of gradient pulses make the spin echo signals sensible to the diffusion of molecules; more precisely, each spin echo signal is attenuated by a coefficient depending on the "ease" of diffusion of water molecules along a direction aligned with that of the gradient.

By performing a plurality of spin-echo acquisitions sensitized by gradient pulses with different orientations, it is possible to estimate a set of model-dependent parameters characterizing the diffusive properties of the target body. In general, in order to obtain a meaningful estimation of these parameters, the gradient orientations need to be at least approximately uniformly distributed in space. The number of acquisitions to be performed depends on the model, but also on the signal-to-noise ratio and on the required accuracy of the estimation. For example, DTI requires at least six acquisitions (plus a seventh reference acquisition, without gradient pulses) for determining six parameters; but since the acquired signals are unavoidably corrupted by noise, the parameters estimate can be improved by using a significantly higher number of pulse sequences, and therefore of gradient orientation.

In clinical practice the number of acquisitions, and therefore of gradient orientations, is determined a priori on an empirical basis. Then, acquisitions are performed and finally data processing is performed offline.

This way of operating has a number of disadvantages.

First of all, if the patient moves during examination, or if some of the acquired signals turn out to be highly corrupted by nose, all the data have to be discarded and the examination has to be repeated anew, because the current processing methods cannot operate on partial data sets. In order to solve this problem, document [8] provides a method for determining the "best" spatial distribution of the gradient orientations, should the acquisition be terminated before completion. Such a sequence consists of a series of small meaningful subsets of uniform orientations, all subsets complementing each other with additional orientations.

Another drawback of prior art magnetic resonance diffusion imaging technique is that in some cases, the preset number of acquisitions turns out, in hindsight, to be insufficient to allow a reliable estimation of diffusion parameters. In this case, the examination has to be repeated. This is both annoying for the patient and costly for the hospital or examination center.

In order to avoid this event, the number of acquisition is usually set at a comparatively high value. But this means that, in most cases, more acquisitions will be performed than it would really be necessary. As a consequence, the expensive MR apparatuses are not used efficiently.

The method of document [8] is of no help for solving these problems because, like conventional methods, it requires a preset number of acquisitions, even if it allows exploitation of incomplete data sets and can even deal with unexpected early termination of the examination.

Document US 2007/038072 discloses a method for performing magnetic resonance diffusion imaging characterized by the use of an incremental estimator for determining the value of diffusion parameters of a target body. This allows:
  reducing the required data storage capacity;
  performing at least part of the required computation in parallel with data acquisition; and
  obtaining intermediate data, rendering the method at least partially tolerant to early termination.

SUMMARY

The invention aims at improving the method of the prior art, in particular in the case of a strongly anisotropic target body such as a brain stem or a spinal cord.

Thus, an object of the present invention is a method for performing magnetic resonance diffusion imaging, comprising:
  (a) acquiring a sequence of magnetic resonance images of a target body using diffusion-encoding gradient pulses applied along a set of non-collinear orientations sampling a three-dimensional orientation space;
  (b) estimating, from said sequence of images, a set of space- and orientation-dependent parameters representative of molecular diffusion within said target body;
  wherein said step of estimating a set of space- and orientation-dependent parameters representative of molecular diffusion within said target body is performed in real time by means of an incremental estimator fed by data provided by said magnetic resonance images; characterized in that said three-dimensional orientation space selectively excludes a set of orientations for which magnetic resonance signal intensity is below a threshold level.

Particular embodiments of the method of the invention are the object of dependent claims 2 to 14.

In particular, according to an advantageous embodiment the invention, real time magnetic resonance diffusion imaging can be performed by using a Kalman filter, preferably in conjunction with the particular choice of the spatial distribution of the gradient orientations disclosed by document [8]. Document [4] discloses the use of a Kalman filter in the field of functional MRI (fMRI).

The method of the invention is particularly advantageous because spin echo signals acquired using gradient pulses aligned along a preferential direction of the target body (i.e. a direction along which molecular mobility is high) are strongly attenuated, and therefore severely affected by noise and biased. Therefore, at least in some cases, it is preferable to exclude these signals, which are more likely to pollute the data than to bring in meaningful information. Moreover, in the framework of a real-time method which can be terminated at any moment (e.g. because the patient has moved), it is particularly important to avoid "wasting time" by performing signal acquisition carrying little or no useful information. This is what this particular method does: in a preliminary step, the preferential orientation(s) of the body is(are) determined; then a refinement step is carried out, avoiding acquisitions along said preferential orientation(s).

Another object of the invention is a computer program product comprising computer program code, suitable to be executed by computerized data processing means connected to a Nuclear Magnetic Resonance Scanner, to make said data processing means perform magnetic resonance diffusion imaging in real time according to the method of the invention.

BRIEF DESCRIPTION OF THE DRAWINGS

Additional features and advantages of the present invention will become apparent from the subsequent description, taken in conjunction with the accompanying drawings, which show:

FIG. 1, an exemplary pulse sequence for performing magnetic resonance diffusion imaging;

FIGS. 2A, 2B and 2C, three cross-sections of a three-dimensional plot of the orientation-dependent relative spin echo intensity, in a strongly oriented structure such as the brain stem;

FIG. 3C, a conventional set of 42 gradient orientations;

FIGS. 3A and 3B, two subsets of the set of orientation represented on FIG. 3C, comprising 14 and 28 orientations respectively;

FIGS. 4A, 4B and 4C, three sets of orientations adapted for carrying out the method of the invention and comprising 14, 28 and 42 orientations respectively; and FIGS. 5A to 5D, Q-ball orientation distribution function (ODF) maps obtained by the real-time method of the invention with 1 (FIG. 5A), 50 (FIG. 5B), 100 (FIG. 5C) and 200 (FIG. 5D) iterations of the incremental estimator. FIG. 5E represents an ODF Q-ball map obtained by offline processing according to the prior art and FIG. 5F identifies the region of interest within the white matter of a human brain.

DETAILED DESCRIPTION

Figure 2D:
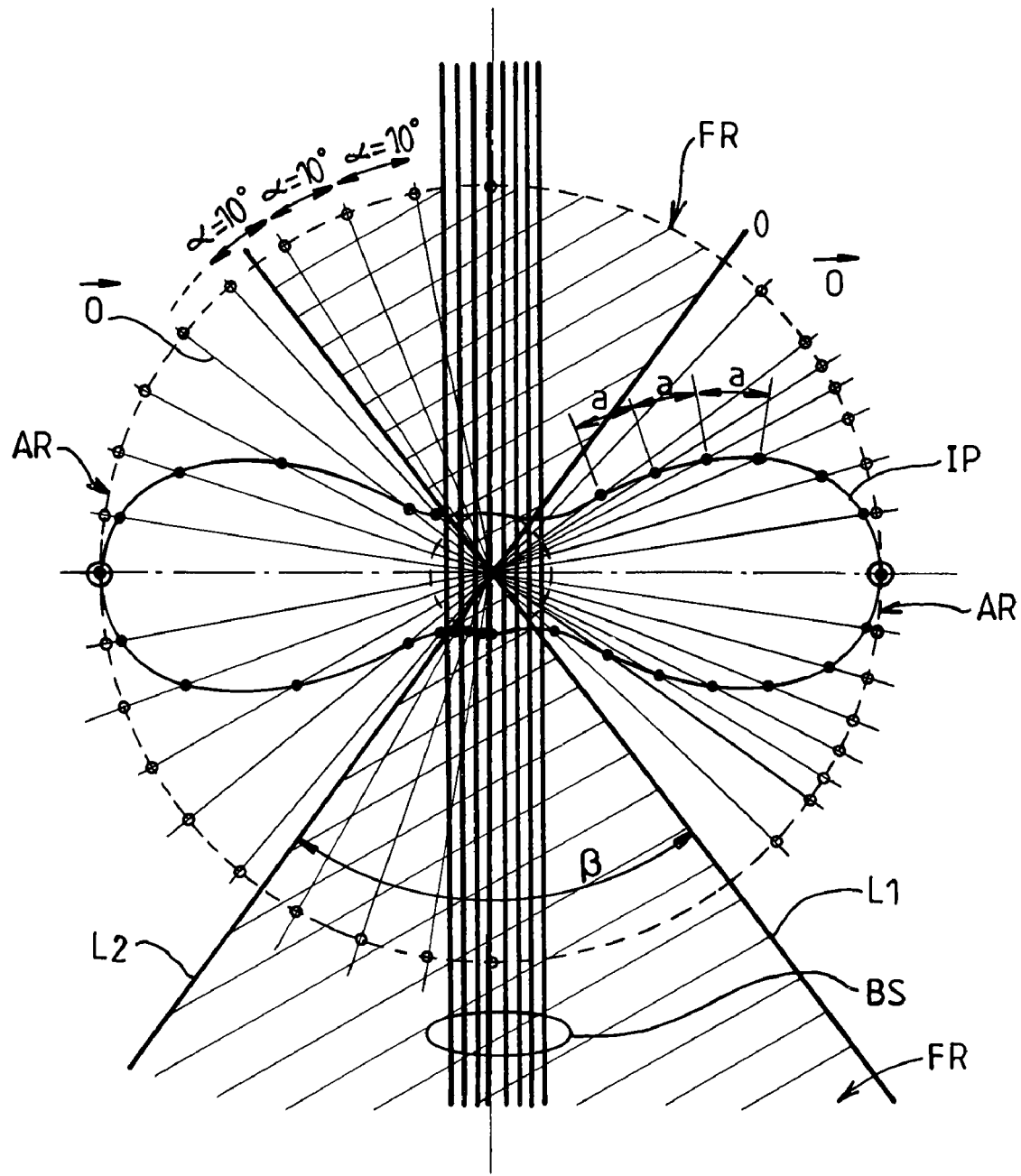
FIG. 2D, a plot illustrating a sampling strategy suitable for diffusion imaging of such a strongly orientated structure.

Magnetic resonance diffusion imaging is based on the spin-echo technique. It is well known in the art of NMR that the free-induction decay $S_1$ observed following an initial excitation pulse ($P_1$ on FIG. 1) decays with time due to both spin-spin relaxation and inhomogeneous effects which cause different spins to precess at different rates. Relaxation leads to an irreversible loss of magnetization (decoherence), but the inhomogeneous dephasing can be reversed by applying a 180° or inversion pulse $P_2$ that inverts the magnetization vectors. If the inversion pulse is applied a time $\Delta$ after the excitation pulse, the inhomogeneous evolution will rephase to form an echo $S_2$ at time $2\Delta$. In magnetic resonance diffusion imaging, a pair of identical gradient pulses $G_1$ and $G_2$, oriented along a direction $\vec{o}$, is also applied at a time $\delta$ after $P_1$ and $P_2$ respectively. The first gradient pulse $G_1$ induce an additional space-dependent dephasing of the nuclear spins. For a nucleus that does not move appreciably during the pulse sequence, this additional dephasing will be perfectly compensated by the second gradient pulse $G_2$, applied after inversion. However, for a nucleus which has moved along the direction $\vec{o}$ between the first and second pulse, due e.g. to molecular diffusion, compensation will only be partial and the spin-echo signal will be attenuated accordingly; the so-called b-parameter (s/mm$^2$) expresses the magnitude of the sensitivity to diffusion of the spin-echo signal. Therefore, measurement of the spin-echo signal attenuation provides information about the molecular diffusion along direction $\vec{o}$. All the parameters of a mathematical model of diffusion can therefore be estimated by acquiring a number of signal-echo signals for different orientations of the diffusion-encoding gradient pulses $G_1$ and $G_2$.

FIGS. 2A, 2B and 2C represents three cross-sections of a plot IP of the orientation-dependent relative spin echo intensity, in a strongly oriented fibrous structure BS, such as a brain stem. The brain stem BS can be considered as a large and homogeneous bundle of white matter fibres aligned along a single principal orientation, labelled as "z" axis. In such a structure, molecules diffuse almost freely along the fibers, and correspondingly the spin-echo signal acquired when the gradient pulses are parallel to said fibers is low. Conversely, diffusion in a direction perpendicular to the fibers is hindered, and the corresponding diffusion-sensitized spin-echo signal is high. On this figure, the ellipsoid EDT represents the estimated diffusion tensor, whose longer principal axis is oriented parallel to the fibers of the structure BS, i.e. along the direction "z" of greater molecular diffusion.

Comparison of FIGS. 2A, 2B and 2C shows that the three-dimensional profile of the signal intensity corresponding to the different diffusion sensitizations is symmetrical around the z-axis and cross-sections in the (xz) and (yz) planes depict a peanut shape.

In standard magnetic resonance diffusion imaging, the number N of acquisitions is determined a priori, and a set of N orientations $\vec{o}$ is identified. According to the prior art, orientations $\vec{o}$ are almost uniformly distributed in space, i.e. they almost uniformly sample a "full" three-dimensional orientation space.

The vertex of the polyhedron of FIG. 3C represent the orientations of an optimal set for N=42. Subsets of a uniform set are not uniform themselves, as it can be seen on FIGS. 3A and 3B.

The above-cited paper by J. Dubois et al. discloses an alternative method of determining an almost-uniform set of orientation, comprising subsets that are also almost uniform. It can be easily seen that the 42-orientation set of FIG. 4C is slightly less uniform than the "conventional" set of FIG. 3C, but the 14- and 28-orientations subsets of FIGS. 4A and 4B are much more uniform than the corresponding subsets of FIGS. 3A and 3B.

The 42-orientation set of FIG. 4C can be decomposed in 3 approximately uniform subsets of 14 orientations, complementing each other in an approximately uniform way.

A uniform set can be generated by minimizing a potential energy resulting from a repulsive (e.g. coulombian) interaction between orientations, represented as points on the surface of a sphere. In order to obtain a "conventional" set, like that of FIG. 3C, all the orientations are assumed to interact with the same strength, i.e. all the points on the surface of the sphere are supposed to carry the same "electrostatic" charge.

The sets of FIGS. 4A to 4C are generated iteratively. For each iteration, the set of orientations (S+1) includes the set generated at the previous iteration (S). S is defined as the smallest set that orientations i and j both belong to. The more distant in time (i.e. in the order of the sequence of spin-echo signal acquisitions) the orientations are, the more reduced is the interaction between them. If i and j belong to the first generated set (S=1), their interaction is maximal: $\alpha_{ij}=1$. If i and j belong to the last set (S=P, with P equal to a preset number of iterations, and therefore of sets), their interaction is minimum: $\alpha_{ij}=a<1$. Otherwise, the interaction coefficient can be defined (but this is just an example) as $\alpha_{ij}=a^{(S-1)/(P-1)}$. In practice, even if P (and therefore the number N of orientations) is defined a priori, more than P set can be generated, i.e. S can become greater than P.

Real-time magnetic resonance diffusion imaging is made possible by the use of an incremental estimator of the diffusion parameters. While a "conventional" set can also be used in conjunction with an incremental estimator, the iteratively generated or "optimal" sets described above are much preferred, because they accelerate the convergence of the incremental estimation.

The Kalman filter [7] is a well-known example of incremental estimator, and it is particularly well suited for carrying out the method of the invention. But before being able to apply it (or any other related incremental estimator) to the problem of estimating molecular diffusion parameters, it is necessary to put the mathematical model of diffusion (e.g. D.T.I. or Q-ball) into a suitable form, the so-called general linear model (G.L.M.), assuming a white noise model. Within this framework, parameter estimation reduces to a least-squares linear regression problem, which can be solved incrementally, e.g. by a Kalman filter.

After the acquisition of the entire volume for each diffusion gradient orientation, this filter can update DTI and QBI maps, provide variance of the estimate and deliver an immediate feedback to the operator carrying out the magnetic resonance diffusion imaging examination.

Two (non limitative) examples of G.L.M. formulations of prior-art mathematical models of molecular diffusion will now be introduced, based on the Diffusion Tensor (D.T.I., or D.T.) and Q-ball (Q.B.I.) theories, respectively.

Let the vector $m=[m_1, \ldots, m_N]$ represent the diffusion-sensitized spin-echo signal measured with N different diffusion gradient orientations at a given voxel in the scanned volume. The gradient orientations $\vec{o}_i$ are indexed by i, corresponding to the time rank during the acquisition and are numbered from 1 to N. The orientation is generated as discussed above. The magnitude of the sensitization is given by the b-value in s/mm². The unweighted signal, measured with diffusion gradients off, is expressed as $m_0$.

The D.T. model states that the diffusion of water molecules can be considered as free, yielding a Gaussian probability density function characterized by a second order tensor D. The signal attenuation observed when applying a diffusion gradient along the normalized direction $\vec{o}=[o_x, o_y, o_z]^T$ of the space and with sensitization b is exponential:

$$m=m_0 e^{-b\vec{o}^T D\vec{o}}=\mu \quad (1)$$

where μ represents the acquisition noise that usually follows a Rician distribution. The natural logarithm of this attenuation gives the general linear model:

$$y=Bd+\epsilon \quad (2)$$

where the measured vector of attenuations is $y=[y_1, \ldots, y_N]^T$, with $y_i=\log(m_0/m_i)$, and $d=[D_{xx}, D_{xy}, D_{xz}, D_{yy}, D_{yz}, D_{zz}]^T$ is the vector of the six unknown coefficients of the diffusion tensor. B is a N×6 matrix called the diffusion sensitization matrix, built from N rows $b_1, \ldots, b_N$ depending only on the diffusion gradient settings $\vec{b}_i=b_i[o_{x,i}^2, 2o_{x,i}o_{y,i}, 2o_{x,i}o_{z,i}, o_{y,i}^2, 2o_{y,i}o_{z,i}, o_{z,i}^2]$, where $b_i$ is a scalar parameter; $\epsilon$ is the N×1 vector of errors $\epsilon_i=-\ln(1+\mu e^{b_i\vec{o}_i^T D\vec{o}_i}/m_0)\approx-\mu e^{b_i\vec{o}_i^T D\vec{o}_i}/m_0$. Theoretically, the noise model depends on the unknowns as well as on the Rician noise, but it is reasonable to assume that it is not far from a Gaussian distribution.

The Q-ball model states that the orientation distribution function (ODF) $\psi(\vec{o})=\int_0^\infty p(r\vec{o})dr$ that gives the likelihood of molecular motion along any orientation $\vec{o}$ can be obtained by sampling a sphere in the Q-space [3], whose radius r is set up by a high b-value (typically greater than 3000 s/mm²) with a great number of gradient orientations (from 160 to 500 according to the literature). A good approximation of the ODF was proposed by Tuch using the Funk-Radon transform (FRT). In order to obtain $\Psi(o_i)$, the FRT integrates the MR signal along the equator of the given orientation $o_i$. A first linear model of the FRT has been published in [5] corresponding to the raw algorithm. More recently, Descoteaux et al [6] proposed an elegant reformulation of the FRT using the Funk-Hecke theorem for decomposing the ODF onto a symmetric, orthonormal and real spherical harmonics. Let $c=[c_1, \ldots, c_K]^T$ be the K×1 vector of coefficients $c_j$ of the spherical harmonics decomposition of the ODF and is calculated from the reconstruction equation:

$$c=P(B^T B+\lambda L)^{-1} B^T m \quad (3)$$

where B is a N×K matrix built from the modified spherical harmonics basis $B_{ij}=Y_j(\theta(o_i), \phi(o_i))$ (θ is the colatitude and φ is the azimuth of the diffusion gradient orientation $o_i$), L is the K×K matrix of the Laplace-Beltrami regularization operator, λ is the regularization factor, P is the K×K Funk-Hecke diagonal matrix with elements $P_{ii}=2\pi P_{I(j)}(0)/P_{I(j)}(1)$ $P_{I(j)}(x)$ is the Legendre polynomial of degree I(j), see also [6] for the definition of I(j)). From the knowledge of the decomposition c, it is possible to obtain the ODF value for the orientation $\vec{o}$ calculating the composition:

$$\psi(o) = \sum_{j=1}^{N} c_j Y_j(\theta(o), \phi(o)) \quad (4)$$

The equation (3) can be reversed to get the general linear model:

$$m=B^+ c+\epsilon \text{ with } B^+=(P(B^T B+\lambda L)^{-1} B^T)^\dagger \quad (5)$$

where ϵ is the vector of Rician acquisition noise that we assume to be Gaussian in order to stay in the ordinary linear least square framework. The $(\ )^\dagger$ stands for the Moore-Penrose pseudo-inverse operator.

The mathematical models of molecular diffusion having been put in general linear model form, an incremental estimator such as the Kalman filter can be used for estimating the parameters of said models.

The Kalman filter is a recursive solver that optimally minimizes the mean square error of an estimation [7]. Because of its recursive nature, it allows updating the DTI or QBI model parameters after the acquisition of each new diffusion-sensitized echo signal. Moreover, the Kalman filter provides, at each time frame, an estimated covariance of the parameter estimate, that quantifies the incertitude affecting said estimate and can therefore be used to automatically stop the scan when the maximum variance falls below a minimum threshold. The general linear models for DTI and QBI, derived above, are of the form y=Ax+Q. The Kalman filter exploits any new measure y for updating the unknown parameters x, usually called the state vector. After the acquisition of rank i, a "current estimate" x̂(i−1) is available. Given the new MR measurement y(i) and the vector a(i)=[$A_{i1}, \ldots, A_{iP}$]$^T$ corresponding to $i^{th}$ row of the matrix A, the so-called "innovation" v(i)=y(i)−a(i)$^T$x̂(i−1) is calculated. The Kalman filter then updates the parameters using the recursion:

$$\begin{cases} k(i) = (1 + a(i)^T P(i-1) a(i))^{-1} P(i-1) a(i) \\ \hat{x}(i) = \hat{x}(i-1) + v(i) k(i) \\ P(i) = P(i-1) - k(i) a(i)^T P(i-1) \end{cases} \quad (6)$$

where the vector k(i) is usually called the Kalman gain. P(i) represents an estimate of the normalized covariance matrix of x given the information at time i. The unnormalized covariance of x̂(i) is equal to σ̂(i)$^2$P(i), where:

$$\hat{\sigma}(i) = \frac{i-1}{i}\left[\hat{\sigma}(i-1) + v(i)^2 (1 + a(i)^T P(i-1) a(i))^{-1}\right] \quad (7)$$

The initial guesses x̂(0), P(0) and σ̂(0) can be respectively set to the null vector, the identity matrix and zero.

The real time diffusion Kalman filter for the QBI model has been evaluated on an adult, under a protocol approved by the Institutional Ethical Committee. Acquisitions have been performed using a DW Dual Spin Echo EPI technique on a 1.5T MRI system (Excite II, GE Healthcare, USA). Pulse sequence settings were b=3000 s/mm$^2$, 200 conventional gradient orientation set, matrix 128×128, 60 slices, field-of-view FOV=24 cm, slice thickness TH=2 mm, TE/TR=93.2 ms/19 s for a QBI scan time of 72 min 50 s.

The Q-ball online Kalman filter has been used for processing ODFs during an ongoing QBI scan. A symmetrical spherical harmonics basis of order 8 was chosen and the Laplace-Beltrami regularization factor was set to 0.006 as proposed in [6]. The ODFs were reconstructed on 400 normalized uniform orientations. The QBI dedicated Kalman filter (5) provides, at each step and for each voxel of brain of the subject within a region of interest ROI (see FIG. 5F), an estimate of the decomposition of the ODF onto a symmetric spherical harmonics basis from which it is easy to obtain the values for any orientation $\vec{o}$ of the space (equation (4)). FIGS. 5A to 5D show the evolution of the ODF map during the Kalman recursion on the region of interest ROI, which is located in the subcortical white matter, and exhibiting some fiber crossings as well as voxels with homogeneous fiber populations. Comparison between FIGS. 5D and 5E shows no qualitative difference between the ODF maps obtained from the online Kalman filter or from the offline Q-ball algorithm given by equation (3). The choice of order 8 can be discussed, because there are 45 spherical harmonic coefficients to estimate, which represents a lot of unknown, and consequently requires a lot of iterations before to converge. A lower order would give satisfactory results after less iterations. The time required for performing one iteration of the QBI Kalman filter on a slice with a 3.2 GHz Linux station is almost 5 seconds, which is lower than the repetition time TR=19 s of the scan. With the present processing code, only four slice locations can be performed in real time. This number can be significantly increased by optimizing said code and by parallelizing it on a grid of processor.

The Kalman filter has also been evaluated for the D.T.I. model, on the same ROI. Pulse sequence settings were b=700 s/mm2, 42 optimum (i.e. iteratively generated) gradient orientation set, matrix 128×128, 60 slices, FOV=24 cm, slice thickness TH=2 mm, TE/TR=66.2 ms/12.5 s for a DTI scan time of 9 min 48 s. Again, after 42 iterations, there is no qualitative difference with respect to the conventional offline processing. The use of an optimum orientation set speeds up the convergence of the estimation that can be considered exploitable by clinicians from the $14^{th}$ iteration. The time required to perform one iteration of the DTI Kalman filter over the full brain is less than 8 seconds on a 3.2 GHz Linux station, which is lower than the repetition time TR=12.5 s of the scan. Consequently, there is no additional delay between two consecutive acquisitions, making this protocol truly real-time.

Until now, it has been assumed that a meaningful estimation of the diffusion parameters can be performed only if the "space of orientations" is almost uniformly sampled, i.e. if the distribution in three-dimensional space of the diffusion-encoding gradient is approximately uniform. However, in some cases a non-uniform orientation distribution can be more advantageous. As already discussed, FIGS. 2A-2C represent a "peanut-shaped" or "eight-shaped" plot IP of the orientation-dependent relative spin echo intensity, in a strongly oriented fibrous structure BS, such as a brain stem. Plot IP shows that the detected signal intensity is maximal (minimal) when the diffusion-encoding gradient is perpendicular (parallel) to the fiber orientation.

A closer observation of the plot IP shows a spherical bulge NB in the central part thereof, representing the contribution of noise. Reference MSL on FIG. 2C identifies the "true" minimal signal contribution, corresponding to the magnetic resonance signal along the "z" direction; reference NL corresponds to the noise level.

Noise contribution is particularly disturbing as it follows a Rician, and not a Gaussian, distribution, and this induces a systematic bias on the amplitude estimation, and therefore also on the estimation of the diffusion tensor. This usually causes underestimation of the fractional anisotropy of the tissue, if the tensor model is used for estimating the diffusion parameters; in the case of the Q-ball model, the orientation distribution functions become smoother and less angularly resolved. In these conditions, it is advisable to avoid acquiring spin-echo signals for gradient orientations parallel or nearly parallel to the fiber direction, in order to minimize said bias.

On FIG. 2D, lines L1 and L2 bound a "forbidden region" FR having the shape of a double cone, constituted by gradient orientations, corresponding to signals too weak to be meaningful, i.e. below a noise-dependent threshold. Reference β represents the angular width of the conical forbidden region FR.

Concretely, a preliminary estimate of the diffusion parameters is performed in real time, in order to determine the direction(s) of preferential orientation of the target body. For example, six or twelve iterations with gradient pulses having uniformly distributed orientations may suffice within the framework of the DT model. Then, additional acquisitions are performed in order to improve the preliminary estimate; but this time the diffusion-encoding gradient pulses are applied along a set of non-collinear orientations belonging to a subspace complementary to said direction of preferential orientation. Otherwise stated, after a preliminary estimate, real-time estimation of the diffusion parameters is performed by selectively excluding the "forbidden" directions aligned or almost aligned with the preferential orientation of the target body and for which the signal level is below—or barely above—the noise level.

The first step of performing a preliminary estimate of the diffusion parameters can be dispensed with, if the preferential orientation of the target body is known a priori with sufficient accuracy.

The allowed region AR, complementary to the forbidden region delimited by lines L1 and L2 (actually, by conical surfaces in three dimension), can be uniformly sampled. A set of orientations $\vec{o}$ contained within the allowed region and suitable for performing real-time diffusion imaging can be obtained according to the "electrostatic" method discussed above with reference to FIGS. 4A-4C. The only difference with the case discussed above is that the "electric charges" do not move on a whole spherical surface, but only on a spherical segment representing the allowed region AR. Such a uniform sampling of the allowed region AR is illustrated on the left part of FIG. 2D, showing orientations separated by a constant angle $\alpha=10°$.

The intersections of the straight lines corresponding to the different orientations with the plot IP of the orientation-dependent relative spin echo intensity highlights the discrepancy of the distance between two neighbour points occurring at the surface of said plot. In many cases, it would be preferable to make uniform the geodesic distance a between neighbours by taking into account the real distance at the surface of the profile. Such a "geodesic" set of orientations $\vec{o}$, illustrated on the right part of FIG. 2D, can be determined by using a modified electrostatic repulsive model, wherein the potential between two neighbor points depends upon the geodesic distance between them on the surface of the plot IP.

In both cases (uniform and geodesic sampling) it is advantageous to consider the positive constraint on the diffusion process by assuming that an orientation and its opposite are equivalent in terms of information about the diffusion process, thus reducing the sampling of the space to half a unit sphere.

As a conclusion, an appropriate choice of the orientations of the diffusion gradients allows improving the accuracy of real-time diffusion imaging by making it less sensitive to noisy measurements, and accelerate the convergence of the incremental solver by providing uncorrupted data measurements, thus diminishing the exam duration and therefore increasing the comfort for the patient.

REFERENCES

[1] D. LeBihan, E. Breton, D. Lallemand. MR imaging of intravoxel incoherent motions: application to diffusion and perfusion in neurologic disorders. Radiology, 161:401-407, 1986
[2] P. J. Basser, J. Mattiello, D. LeBihan. Estimation of the effective self-diffusion tensor from the NMR spin echo. Journal of Magnetic Resonance, 103:247-254, 1994
[3] D. Tuch. Diffusion MRI of complex tissue structure. PhD thesis, Harvard-MIT, 2002
[4] A. Roche, P. Pinel, S. Dehaene, J.-B. Poline. Solving incrementally the fitting and detection problems in fMRI time series. In Proc. $7^{th}$ MICCAI, Saint-Malo, France, vol. 3217 in LNCS:719-726, 2004
[5] D. Tuch. Q-ball imaging. Magn. Reson. Med., 52:1358-1372, 2004
[6] M. Descoteaux, E. Angelino, S. Fitzgibbons, R. Deriche. A fast and robust ODF estimation algorithm in Q-ball imaging. In Proc. ISBI'06, Arlington, USA, 81-84, 2006
[7] R. E. Kalman, "A New Approach to Linear Filtering and Prediction Problems", Transactions of the ASME, Journal of Basic Engineering, 82 (Series D): 35-45 (1960).
[8] J. Dubois, C. Poupon, F. Lethimonnier, D. LeBihan. Optimized diffusion gradient orientation schemes for corrupted clinical DTI data sets. MAGMA, 19:134-143, 2006.

The invention claimed is:

1. A method for performing magnetic resonance diffusion imaging of a body showing anisotropic molecular diffusion, comprising:
   (a) acquiring a sequence of magnetic resonance images of a target body using diffusion-encoding gradient pulses applied along a set of non-collinear orientations sampling a three-dimensional orientation space;
   (b) estimating, from said sequence of images, a set of space- and orientation-dependent parameters representative of molecular diffusion within said target body;
      wherein said step of estimating a set of space- and orientation-dependent parameters representative of molecular diffusion within said target body is performed in real time by means of an incremental estimator fed by data provided by said magnetic resonance images; characterized in that said three-dimensional orientation space selectively excludes a set of orientations for which magnetic resonance signal intensity is below a threshold level.

2. A method according to claim 1, wherein said set of orientations for which signal intensity is below a threshold level forms a double cone centered around a given orientation of the target body.

3. A method according to claim 2, further comprising a preliminary step of performing magnetic resonance diffusion imaging of said target body based on a smaller set of non-collinear orientations in order to identify said preferential orientation thereof.

4. A method according to claim 1, wherein said threshold level is of the order of a rician noise level affecting magnetic resonance signals.

5. A method according to claim 1, wherein said non-collinear orientations are approximately uniformly distributed within said three-dimensional orientation space.

6. A method according to claim 5, wherein said set of non-collinear orientations consists of a succession of smaller subsets of orientations having an approximately uniform distribution within said three-dimensional orientation space, said subsets complementing each other with additional orientations.

7. A method according to claim 6, further comprising a step of determining said set of non-collinear orientations by minimizing an energy function expressed as a sum of potentials arising from repulsive interactions between all pairs of orientations, the strength of the repulsive interaction between two orientations decreasing as their distance, in the sequence order, increases.

8. A method according to claim 7, further comprising:
   computing, in real time, a parameter quantifying an incertitude affecting the estimated set of parameters representative of molecular diffusion within said target body; and
   acquiring additional magnetic resonance images using diffusion-encoding gradient pulses applied along additional orientation until said parameter quantifying an incertitude affecting said estimate falls below a minimum threshold, or until a maximum number of acquisitions is reached.

9. A method according to claim 6, further comprising:
computing, in real time, a parameter quantifying an incertitude affecting the estimated set of parameters representative of molecular diffusion within said target body; and
acquiring additional magnetic resonance images using diffusion-encoding gradient pulses applied along additional orientation until said parameter quantifying an incertitude affecting said estimate falls below a minimum threshold, or until a maximum number of acquisitions is reached.

10. A method according to claim 1, wherein said non-collinear orientations are such that their intersections with a surface representing a plot of the magnetic resonance signal intensity as a function of gradient orientation have a uniform geodesic distance.

11. A method according to claim 10, wherein said set of non-collinear orientations consists of a succession of smaller subsets of orientations whose intersections with said estimated plot have an approximately uniform geodesic distance within said three-dimensional orientation space, said subsets complementing each other with additional orientations.

12. A method according to claim 11, further comprising a step of determining said set of non-collinear orientations by minimizing an energy function expressed as a sum of potentials arising from repulsive interactions between all pairs of orientations, the strength of the repulsive interaction between two orientations decreasing as their distance, in the sequence order, increases.

13. A method according to claim 1, wherein said space- and orientation-dependent parameters are the parameters of a mathematical model of molecular diffusion within said target body, expressed in the form of a general linear model.

14. A method according to claim 13, wherein said incremental estimator is a Kalman filter.

15. A method according to claim 1, wherein said set of space- and orientation-dependent parameters representative of molecular diffusion within said target body comprises six independent elements of a symmetric diffusion tensor.

16. A method according to claim 1, wherein said space- and orientation-dependent parameters, representative of molecular diffusion within said target body, are proportional to the likelihood of molecular motion along said orientations.

17. A computer program product comprising computer program code, suitable to be executed by computerized data processing means connected to a Nuclear Magnetic Resonance Scanner, to make said data processing means perform a method for performing magnetic resonance diffusion imaging of a body showing anisotropic molecular diffusion, comprising:
(a) acquiring a sequence of magnetic resonance images of a target body using diffusion-encoding gradient pulses applied along a set of non-collinear orientations sampling a three-dimensional orientation space;
(b) estimating, from said sequence of images, a set of space- and orientation-dependent parameters representative of molecular diffusion within said target body;
wherein said step of estimating a set of space- and orientation-dependent parameters representative of molecular diffusion within said target body is performed in real time by means of an incremental estimator fed by data provided by said magnetic resonance images; characterized in that said three-dimensional orientation space selectively excludes a set of orientations for which magnetic resonance signal intensity is below a threshold level.

* * * * *